United States Patent
Shim

(10) Patent No.: US 8,786,077 B2
(45) Date of Patent: Jul. 22, 2014

(54) SEMICONDUCTOR DEVICE HAVING A FIRST SUBSTRATE CONTAINING CIRCUIT ELEMENT CONNECTED TO RADIATION PLATE ON A COVER PLATE WITH METAL VIAS

(75) Inventor: Jeoungchill Shim, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 13/333,099

(22) Filed: Dec. 21, 2011

(65) Prior Publication Data

US 2012/0313257 A1 Dec. 13, 2012

(30) Foreign Application Priority Data

Jun. 7, 2011 (JP) ................................. 2011-127325

(51) Int. Cl.
*H01L 23/10* (2006.01)
*H01L 23/34* (2006.01)

(52) U.S. Cl.
USPC ........... 257/707; 257/704; 257/706; 257/712; 257/713; 257/720; 257/721; 257/722; 257/726; 257/727

(58) Field of Classification Search
None
See application file for complete search history.

(56) References Cited

U.S. PATENT DOCUMENTS

| | | | |
|---|---|---|---|
| 5,767,578 A * | 6/1998 | Chang et al. | ................... 257/717 |
| 6,800,886 B2 | 10/2004 | Awano | |
| 6,812,558 B2 * | 11/2004 | Chen et al. | ..................... 257/688 |
| 7,893,529 B2 * | 2/2011 | Hsu et al. | ....................... 257/713 |
| 2003/0209802 A1 | 11/2003 | Awano | |
| 2012/0139097 A1 * | 6/2012 | Jin et al. | ......................... 257/712 |
| 2012/0161146 A1 | 6/2012 | Shim | |

FOREIGN PATENT DOCUMENTS

| | | |
|---|---|---|
| JP | 3-62542 A | 3/1991 |
| JP | 2003-318234 A | 11/2003 |
| JP | 2003-332504 A | 11/2003 |
| JP | 2010-285681 | 12/2010 |
| WO | WO 99/54935 A1 | 10/1999 |

OTHER PUBLICATIONS

Office Action issued Apr. 16, 2013 in Japanese Patent Application No. 2011-127325 with English language translation.
J. W. Johnson, et al., "Material, Process, and device development of GaN-Based HFET's on Silicon Substrates", Electrochemical Society Proceedings, 6, 2004, pp. 405-419.
L. Shen, et al., "High-Power Polarization-Engineered GaN/AlGaN/GaN HEMTs Without Surface Passivation", IEEE Electron Device Letters, vol. 25, No. 1, Jan. 2004, 3 pages.

* cited by examiner

*Primary Examiner* — Michael Jung
(74) *Attorney, Agent, or Firm* — Oblon, Spivak, McClelland, Maier & Neustadt, L.L.P.

(57) ABSTRACT

Certain embodiments provide a semiconductor device including a first substrate, a circuit element, a second substrate, a metal layer, and a radiation plate. The circuit element is formed on a front surface of the first substrate and has an electrode. The second substrate has a first face, and is laminated on the first substrate so that the first face of the second substrate faces a front surface of the first substrate. The second substrate has a via hole arranged on the electrode. The metal layer is formed inside of the via hole. The radiation plate is formed on a second face of the second substrate, and is connected to the metal layer.

7 Claims, 9 Drawing Sheets

SEMICONDUCTOR DEVICE HAVING A FIRST SUBSTRATE CONTAINING CIRCUIT ELEMENT CONNECTED TO RADIATION PLATE ON A COVER PLATE WITH METAL VIAS

CROSS REFERENCE TO RELATED APPLICATIONS

This application is based upon and claims the benefit of priority from the prior Japanese Patent Application No. 2011-127325 filed in Japan on Jun. 7, 2011; the entire contents of which are incorporated herein by reference.

FIELD

Embodiments described herein relate generally to semiconductor device and method for manufacturing the semiconductor device.

BACKGROUND

In general, power devices using compound semiconductor elements such as GaAs, GaN are required to achieve a higher frequency. As a result, a current density increases, which generates heat, and therefore, the operation temperature of the device increases.

As the temperature during operation of the device increases, characteristics are usually deteriorated, e.g., an ON-resistance and a leakage current increase. Therefore, heat dissipating performance of a device is a parameter controlling the characteristics of the device.

Therefore, in order to suppress the degradation of the device characteristics, a method for dissipating the heat generated in the semiconductor element is used. The method includes replacing a supporting substrate with a material having high heat dissipating performance or providing a radiation fin in a package. However, since the heat is dissipated via the semiconductor substrate having a relatively low thermal conductivity and further via the package, the thermal path becomes longer, which makes it difficult to obtain sufficient heat dissipation effect.

DETAILED DESCRIPTION

Certain embodiments provide a semiconductor device including a first substrate, a circuit element, a second substrate, a metal layer, and a radiation plate. The circuit element is formed on a front surface of the first substrate and has an electrode. The second substrate has a first face, and is laminated on the first substrate so that the first face of the second substrate faces a front surface of the first substrate. The second substrate has a via hole arranged on the electrode. The metal layer is formed inside of the via hole. The radiation plate is formed on a second face of the second substrate, and is connected to the metal layer.

Certain embodiments provide a semiconductor device including a first substrate, a circuit element, a second substrate, a plurality of metal layers, and a plurality of radiation plates. The circuit element is formed on a front surface of the first substrate and has a plurality of electrodes. The second substrate has a first face, and is laminated on the first substrate so that the first face of the second substrate faces a front surface of the first substrate. The second substrate has a plurality of via holes respectively arranged on the plurality of electrodes. The plurality of metal layers are respectively formed inside of the plurality of via holes. The plurality of radiation plates are formed on a second face of the second substrate and respectively connected to the plurality of metal layers.

Certain embodiments provide a method for manufacturing the semiconductor element including the steps of forming a circuit element having an electrode on a first substrate, forming a via hole penetrating through a second substrate, laminating the second substrate on the first substrate, and forming a metal layer and forming a radiation plate connected to the metal layer. In the step of forming the electrode, the electrode connected to the element region is formed on the first substrate. In the step of laminating the second substrate on the first substrate, the second substrate is laminated on the first substrate so that the via hole is arranged on the electrode and the first face of the second substrate faces a front surface of the first substrate. In the step of forming the metal layer and forming the radiation plate connected to the metal layer, a metal layer is formed within the via hole, a radiation plate connected to the metal layer is formed on a second face of the second substrate.

A semiconductor device and a method for manufacturing the semiconductor device according to embodiments will be hereinafter explained.

First Embodiment

Figure 1:
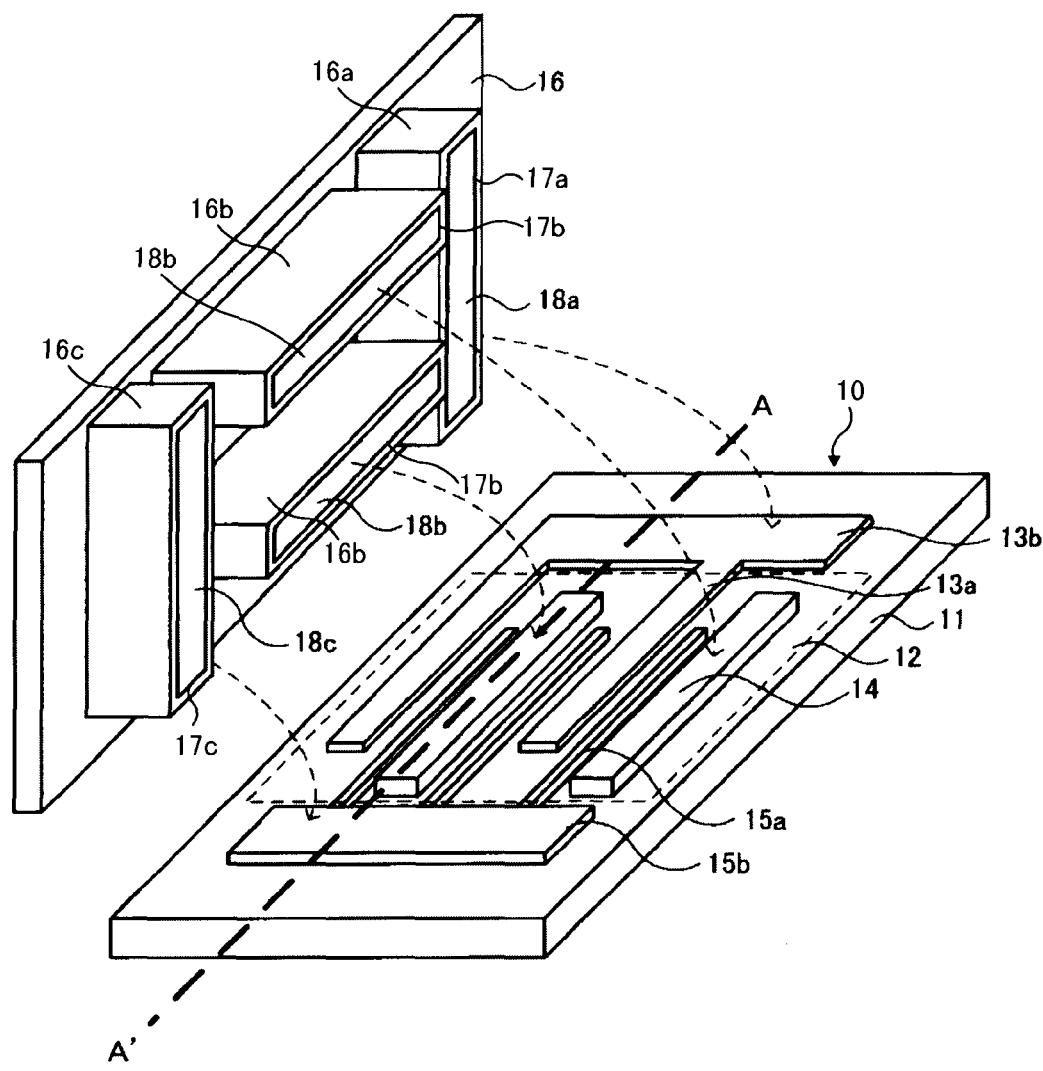
FIG. 1 is an exploded perspective view illustrating a semiconductor device according to a first embodiment.

FIG. 1 is an exploded perspective view illustrating a semiconductor device according to the present embodiment. As shown in FIG. 1, the semiconductor device includes a circuit element and a cover substrate 16. The circuit element is a semiconductor element 10, for example. In the semiconductor element 10, an element region 12 including an impurity diffusion region of the semiconductor element is formed on the surface of the semiconductor substrate 11 including, e.g., GaAs, serving as the first substrate. A plurality of electrodes are formed on the semiconductor substrate 11.

The plurality of electrodes include a source electrode 13a, a drain electrode 14, a gate electrode 15a, a source pad 13b, and a gate pad 15b. The source electrode 13a, the drain electrode 14, and the gate electrode 15a arranged to be sandwiched therebetween are formed to be connected to the element region 12. Further, the source pad 13b, i.e., the electrode pad, is connected to the source electrode 13a, and the gate pad 15b, i.e., the other electrode pad, is connected to the gate electrode 15a.

The cover substrate 16 serving as the second substrate is made of, e.g., GaAs. On the back surface, i.e., the first face of the cover substrate 16, a plurality of protruding portions 16a, 16b, 16 are formed to protrude from the back surface. The plurality of protruding portions 16a, 16b, 16c are made of, e.g., the same material as that of the cover substrate 16, i.e., GaAs.

The protruding portion 16a is formed to be in contact with the source pad 13b when the cover substrate 16 is laminated on the semiconductor element 10. The protruding portion 16b is formed to be in contact with the drain electrode 14 when the cover substrate 16 is laminated on the semiconductor element 10. The protruding portion 16c is formed to be in contact with the gate pad 15b when the cover substrate 16 is laminated on the semiconductor element 10.

The plurality of protruding portions 16a, 16b, 16c are formed such that a summation of the height of the protruding portion 16a and the thickness of the source pad 13b, a summation of the height of the protruding portion 16b and the thickness of the drain electrode 14, and a summation of the height of the protruding portion 16c and the thickness of the gate pad 15b are all the same.

The protruding portions 16a, 16b, 16c are respectively formed with via holes 17a, 17b, 17c penetrating through the protruding portions 16a, 16b, 16c and the cover substrate 16. The inner side walls of these via holes 17a, 17b, 17c are substantially perpendicular to the cover substrate 16. Further, metal layers 18a, 18b, 18c are formed inside of these via holes 17a, 17b, 17c, respectively.

The protruding portions 16a, 16b, 16c are formed so that the protruding portions 16a, 16b, 16c are spaced apart from each other. This improves the insulating performance between the metal layers 18a, 18b, 18c.

This cover substrate 16 is laminated on the semiconductor substrate 11 such that the back surface of the substrate 16 faces the front surface of the semiconductor substrate 11.

Figure 2:
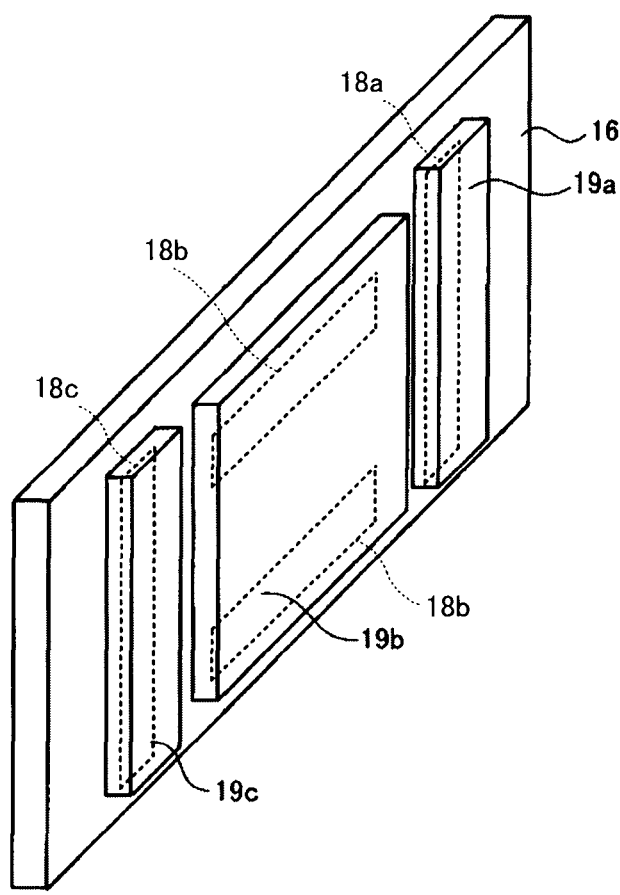
FIG. 2 is a perspective view illustrating a cover substrate when the cover substrate is seen from a front surface side.

FIG. 2 is a perspective view illustrating a cover substrate when the cover substrate is seen from a front surface side. As shown in FIG. 2, radiation plates 19a, 19b, 19c are formed on the front surface, i.e., the second face of the cover substrate 16, so that the radiation plates 19a, 19b, 19c are connected to the metal layers 18a, 18b, 18c, respectively. The radiation plates 19a, 19b, 19c are made of metal, for example. These radiation plates 19a, 19b, 19c also function as metal electrodes. The semiconductor device is electrically connected to the outside via the radiation plates 19a, 19b, 19c. It should be noted, as shown in FIG. 2, the radiation plate 19b connected to the metal layer 18b in contact with the drain electrode 14 (FIG. 1) preferably has a larger size of area than the other radiation plates 19a, 19c. This is because of the following reasons.

In general, the heat source of the semiconductor element is located at a position where there is the largest displacement in the electric field distribution of the semiconductor element, and such position changes according to the device structure. Therefore, by radiating as much heat as possible from the places near the heat source, the heat dissipating performance of the semiconductor element can be improved.

In general, in semiconductor elements such as FETs, the potential difference between gate/drain is larger than the potential difference source/gate, and a larger amount of heat is generated therefrom. In such device, it is preferable to dissipate more heat from the drain electrode 14 closer to the heat source and having a larger electrode area than the gate electrode 15a. Therefore, the radiation plate 19b is formed to have a larger size of area than the other radiation plates 19a, 19c.

Figure 3:
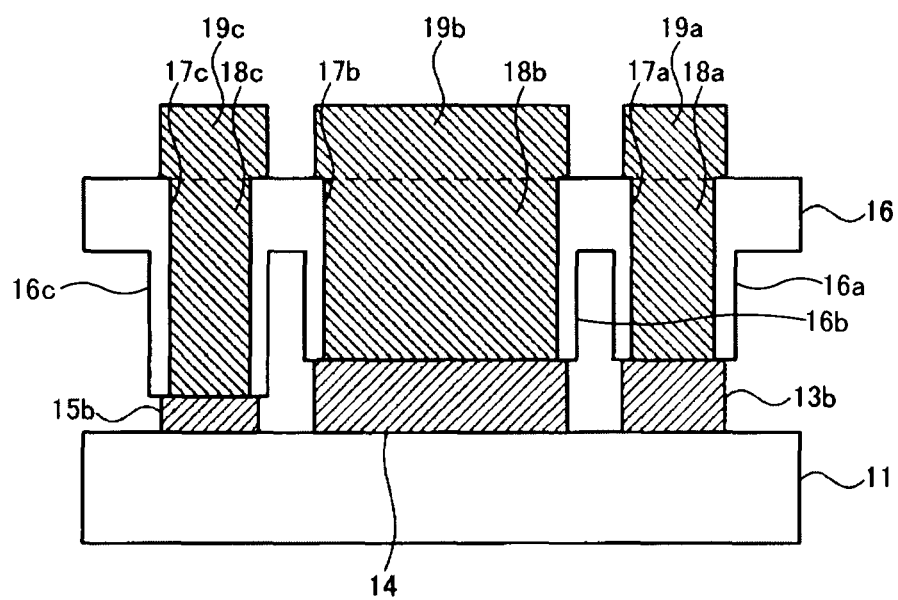
FIG. 3 is a cross sectional view taken along A-A' of FIG. 1.

FIG. 3 shows a cross sectional view taken along A-A' of FIG. 1. As shown in FIG. 3, the source pad 13b connected to the source electrode 13a, the drain electrode 14, and the gate pad 15b connected to the gate electrode 15a are formed on the semiconductor substrate 11. The thicknesses of the source pad 13b and the drain electrode 14 are thicker than the thickness of the gate pad 15b.

The cover substrate 16 having the protruding portions 16a, 16b, 16c on the back surface is laminated on the semiconductor substrate 11. The protruding portions 16a, 16b, 16c are formed with the via holes 17a, 17b, 17c arranged on the source pad 13b, the drain electrode 14, and the gate pad 15b, respectively. The metal layers 18a, 18b, 18c are formed inside of the via holes 17a, 17b, 17c, respectively. The metal layers 18a, 18b, 18c are formed to fill the via holes 17a, 17b, 17c, and are connected to the radiation plates 19a, 19b, 19c, respectively, on the front surface side of the cover substrate 16.

The semiconductor device explained above is packaged by laminating the cover substrate 16 on the semiconductor substrate 11. That is, when the cover substrate 16 is laminated on the semiconductor substrate 11, the semiconductor device operates in the same manner as a conventional semiconductor device in which a semiconductor element is arranged inside a package made of metal and the like.

Subsequently, a method for manufacturing the above semiconductor device will be explained with reference to FIGS. 4A to 4K. FIGS. 4A to 4K are cross sectional views illustrating the manufacturing process of the semiconductor device according to the first embodiment.

Figure 4A:
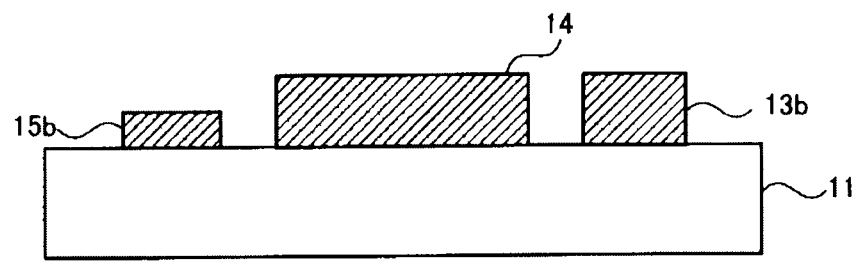
FIG. 4A is a cross sectional view illustrating a manufacturing process of the semiconductor device according to the first embodiment.

As shown in FIG. 4A, first, source region/drain regions (not shown) constituting the gate electrode 15a and the element region 12 are formed on the semiconductor substrate 11. Then, a source electrode, a drain electrode 14 respectively connected to the source region/the drain region, the source pad 13b connected to the source electrode, and the gate pad 15b connected to the gate electrode are formed. At this occasion, for example, the electrodes (including the electrode pads) are made of Au and the like. The source pad 13b and the drain electrode 14 are formed so that the electrode thicknesses of the source pad 13b and the drain electrode 14 are thicker than the electrode thickness of the gate pad 15b. It should be noted that the front surface of the semiconductor element thus formed is protected with a passivation film and the like.

Subsequently, using ordinary photolithography technique, the protruding portions 16a, 16b, 16c are formed on the cover substrate 16 in accordance with the electrode thicknesses of the source pad 13b, the drain electrode 14, and the gate pad 15b of the semiconductor element 10. This will be hereinafter explained more specifically.

Figure 4B:
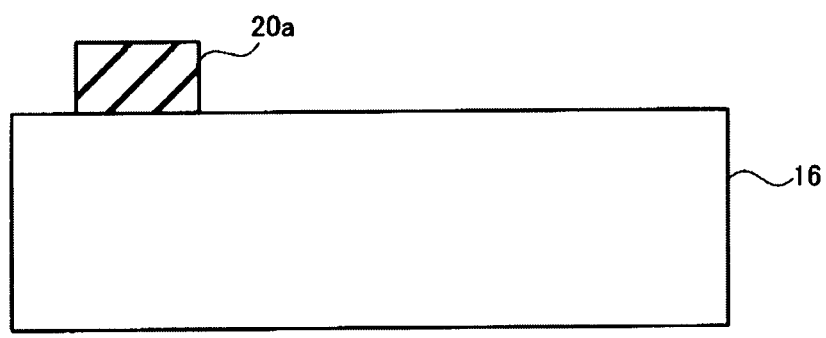
FIG. 4B is a cross sectional view illustrating the manufacturing process of the semiconductor device according to the first embodiment.
Figure 4C:
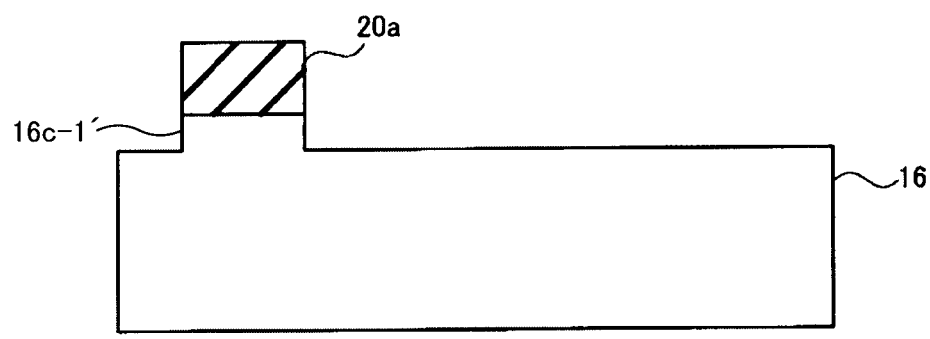
FIG. 4C is a cross sectional view illustrating the manufacturing process of the semiconductor device according to the first embodiment.
Figure 4D:
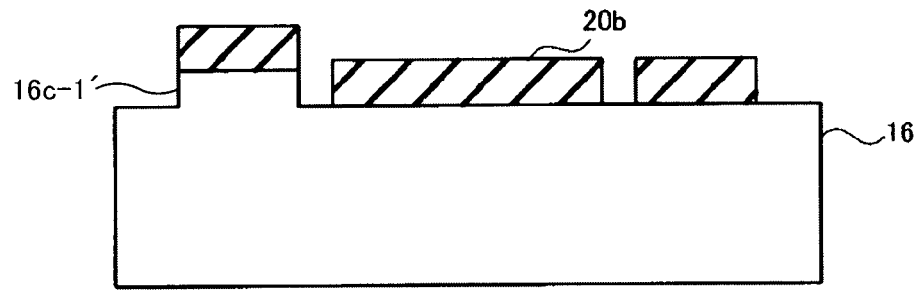
FIG. 4D is a cross sectional view illustrating the manufacturing process of the semiconductor device according to the first embodiment.
Figure 4E:
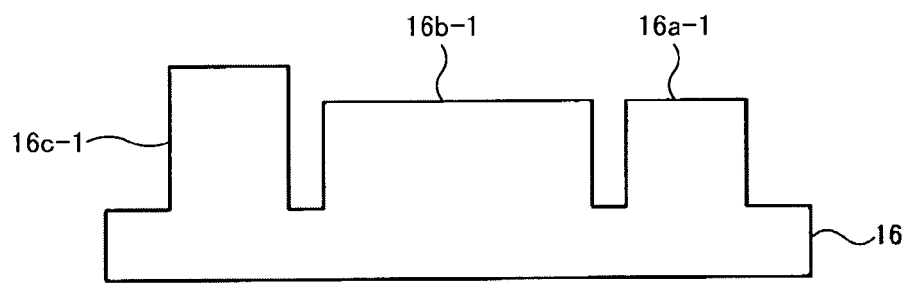
FIG. 4E is a cross sectional view illustrating the manufacturing process of the semiconductor device according to the first embodiment.

First, as shown in FIG. 4B, a photoresist pattern 20a is formed in a portion on the back surface of the cover substrate 16 in which a gate electrode is arranged. As shown in FIG. 4C, a protruding pattern 16c-1' is formed by etching. Further, as shown in FIG. 4D, a photoresist pattern 20b is formed in portions on the back surface of the cover substrate 16 where the source pad 13b, the drain electrode 14, and the gate pad 15b are arranged. As shown in FIG. 4E, protruding patterns 16c-1, 16b-1, 16a-1 having different heights are formed on the cover substrate 16 by etching process.

Figure 4F:
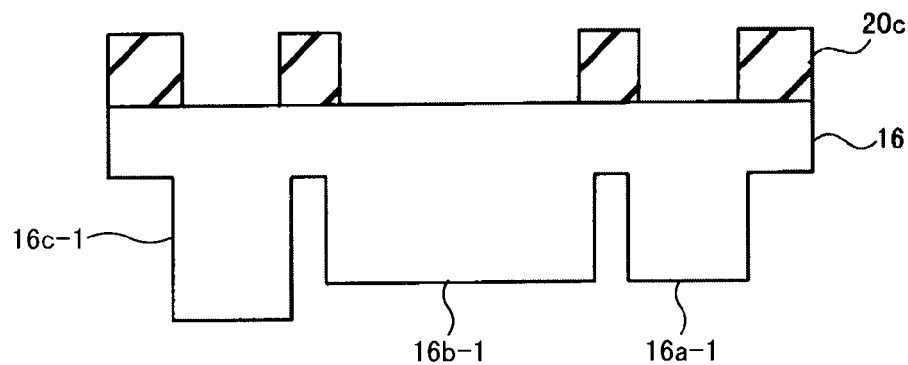
FIG. 4F is a cross sectional view illustrating the manufacturing process of the semiconductor device according to the first embodiment.

Subsequently, as shown in FIG. 4F, a photoresist pattern 20c is formed on the flat front surface of the cover substrate 16.

Figure 4G:
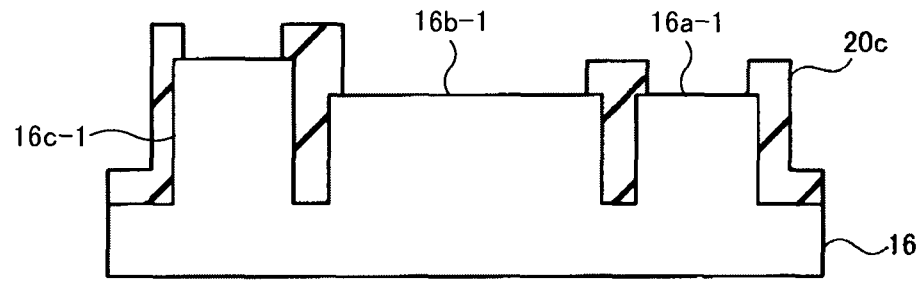
FIG. 4G is a cross sectional view illustrating a modification of the process as shown in FIG. 4F.
Figure 4H:
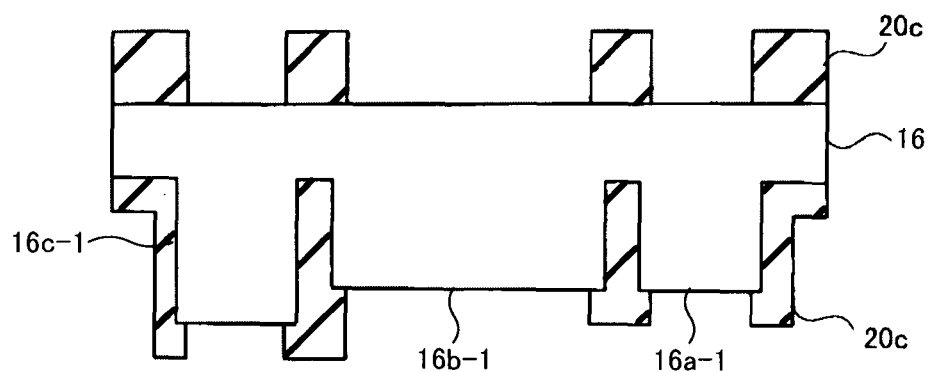
FIG. 4H is a cross sectional view illustrating another modification of the process as shown in FIG. 4F.

Alternatively, as shown in FIG. 4G, the photoresist pattern 20c may be formed on the back surface of the cover substrate 16 on which the protruding patterns 16c-1, 16b-1, 16a-1 are formed, or as shown in FIG. 4H, the photoresist patterns 20c may be formed on both sides of the cover substrate 16.

Figure 4I:
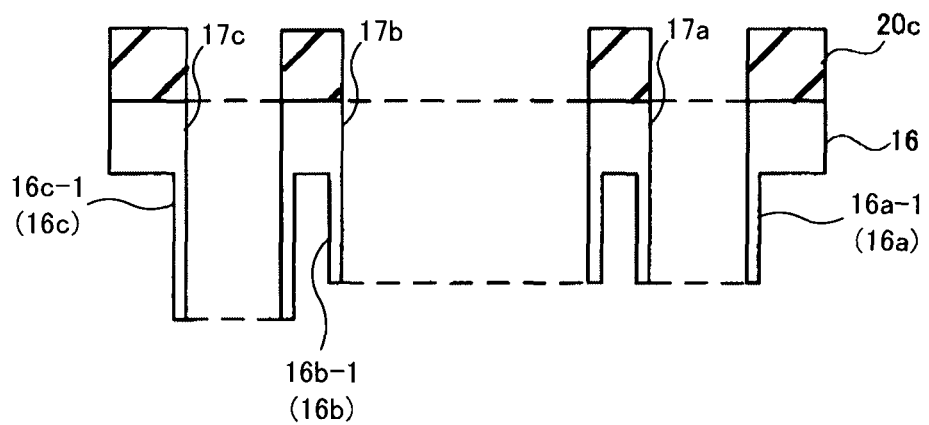
FIG. 4I is a cross sectional view illustrating the manufacturing process of the semiconductor device according to the first embodiment.

Subsequently, as shown in FIG. 4I, the via holes 17a, 17b, 17c penetrating through the cover substrate 16 and the protruding patterns 16c-1, 16b-1, 16a-1 are formed by etching process. As a result, the plurality of protruding portions 16a, 16b, 16c are formed on the back surface of the cover substrate 16. At this occasion, the etching direction may be determined as necessary on the basis of the etching recipe, the coverage ratio of the photoresist pattern, and the alignment accuracy.

Figure 4J:
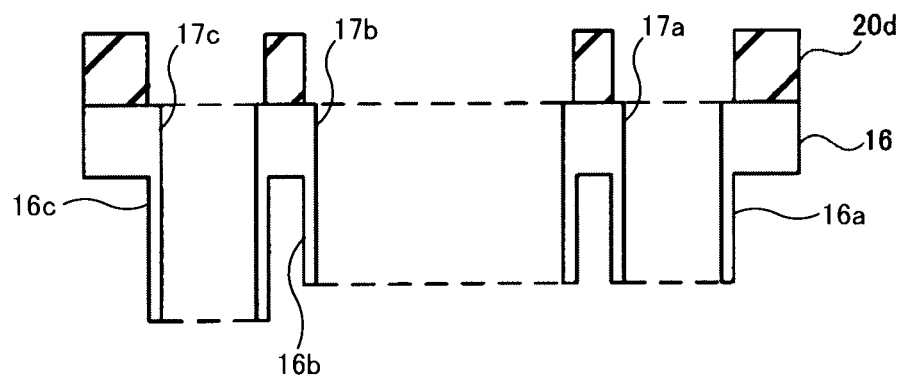
FIG. 4J is a cross sectional view illustrating the manufacturing process of the semiconductor device according to the first embodiment.
Figure 4K:
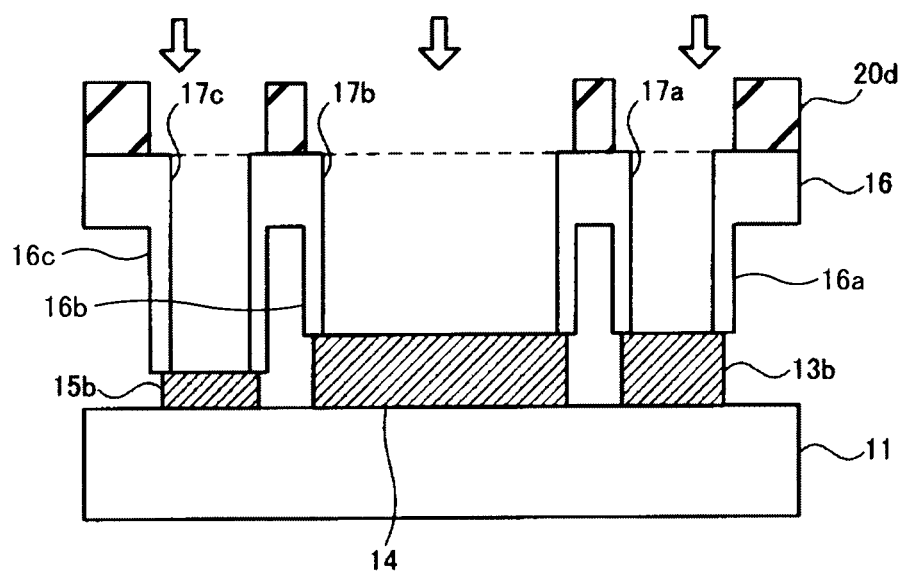
FIG. 4K is a cross sectional view illustrating the manufacturing process of the semiconductor device according to the first embodiment.

Subsequently, as shown in FIG. 4J, a photoresist pattern 20d is formed on the front surface of the cover substrate 16, and as shown in FIG. 4K, the cover substrate 16 having the via holes 17a, 17b, 17c formed therethrough is pressed against and attached to the semiconductor substrate 11, so that the cover substrate 16 is laminated on the semiconductor substrate 11. Alternatively, the photoresist pattern 20d may be formed after the cover substrate 16 is laminated.

At this occasion, when the source pad 13b, the drain electrode 14, and the gate pad 15b are formed with soft metal such as Au, a small amount of error in the etching process is tolerated. Furthermore, the adhesion can be improved by using a low-temperature metal bonding method for pressure bonding with heat.

Then, the metal layers 18a, 18b, 18c such as Au are formed within the via holes 17a, 17b, 17c by metal deposition, and the radiation plates 19a, 19b, 19c are formed on the front surface of the cover substrate 16 by metal deposition. By removing the photoresist pattern 20d, the semiconductor device as shown in FIGS. 1 and 2 is manufactured. It should be noted that a passivation film and the like are preferably formed between the semiconductor substrate 11 and the cover substrate 16.

In the semiconductor device explained above, the heat generated within the semiconductor element 10 is transmitted from the drain electrode 14, the source pad 13b, and the gate pad 15b to the radiation plates 19b, 19a, 19c via the metal layers 18b, 18a, 18c formed within the via hole 17b, 17a, 17c penetrating through the cover substrate 16, so that the heat can be dissipated to the outside of the device by way of the radiation plates 19b, 19a, 19c. In the semiconductor device according to the present embodiment, the heat generated within the semiconductor element 10 can be dissipated to the outside of the device by way of the radiation plates 19b, 19a, 19c without relying on the semiconductor substrate having a relatively low thermal conductivity and without relying on the package. Therefore, according to the present embodiment, the heat dissipating performance can be improved. In addition, the reduction of the device characteristics caused by generated heat can be suppressed.

Figure 5:
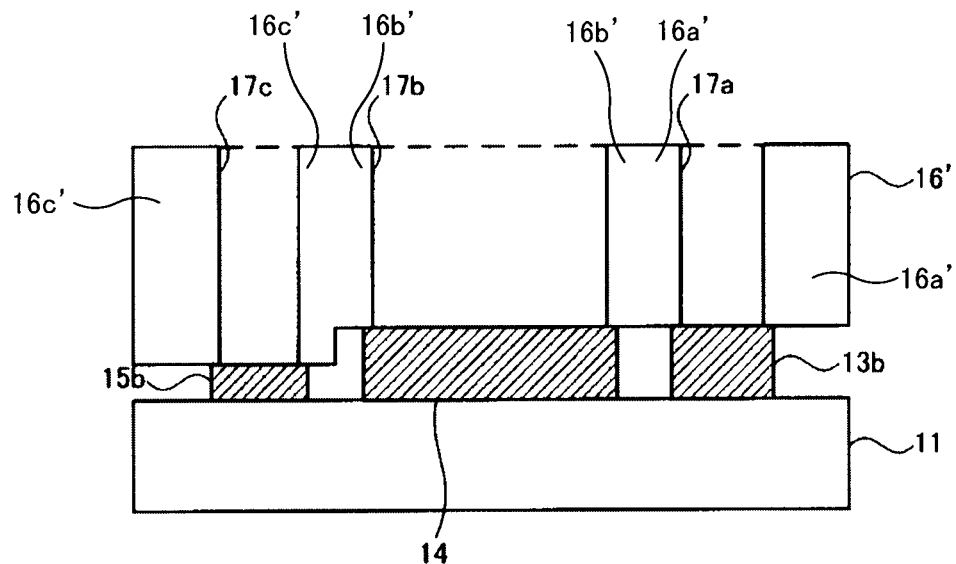
FIG. 5 is a cross sectional view illustrating a semiconductor device according to a modification of the first embodiment.

It should be noted that the shape of the cover substrate 16 having the protruding portions 16a, 16b, 16c formed on the back surface thereof is not particularly limited. Alternatively, as shown in FIG. 5, a cover substrate 16' may have a two-stage shape. That is, the cover substrate 16' may be in a shape having a plurality of protruding portions 16a', 16b', 16c' in contact with each other. When the cover substrate 16' is made in such shape, a step can be made with only one patterning process and one etching process. Alternatively, the alignment margin may be increased when the pattern of the cover substrate 16 and the via holes 17a, 17b, 17c are formed.

Figure 6:
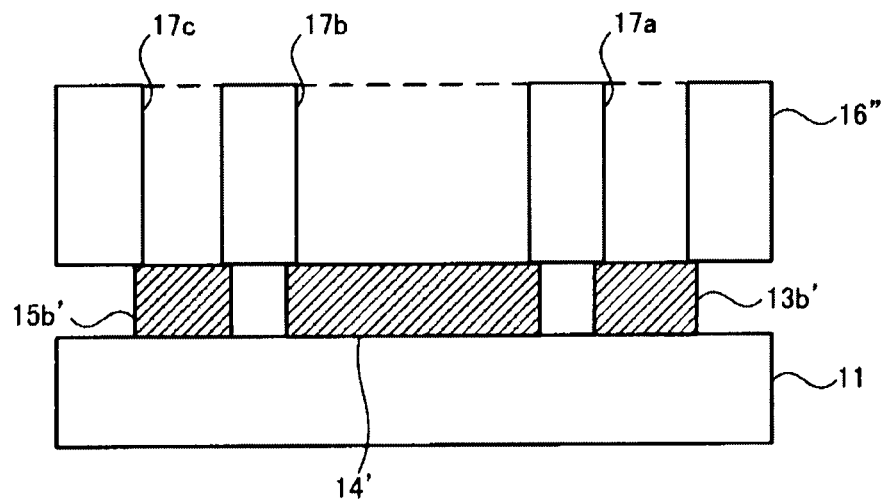
FIG. 6 is a cross sectional view illustrating a semiconductor device according to another modification of the first embodiment.

Still alternatively, as shown in FIG. 6, if the electrode thicknesses of a source pad 13b', a drain electrode 14', and a gate pad 15b' are substantially the same (within a tolerable range of deformation during pressure bonding), it is not necessary to form a step in a cover substrate 16" (the protruding portions 16a, 16b, 16c as shown in FIG. 1 or the protruding portions 16a', 16b', 16c' as shown in FIG. 5). In other words, the cover substrate 16" may have a shape whose back surface is flat. When the cover substrate 16" is made in such shape, the patterning and etching processes for forming a step are not necessary, and the number of manufacturing processes can be reduced. Still alternatively, the alignment margin may be increased when the via holes 17a, 17b, 17c are formed.

Figure 7:
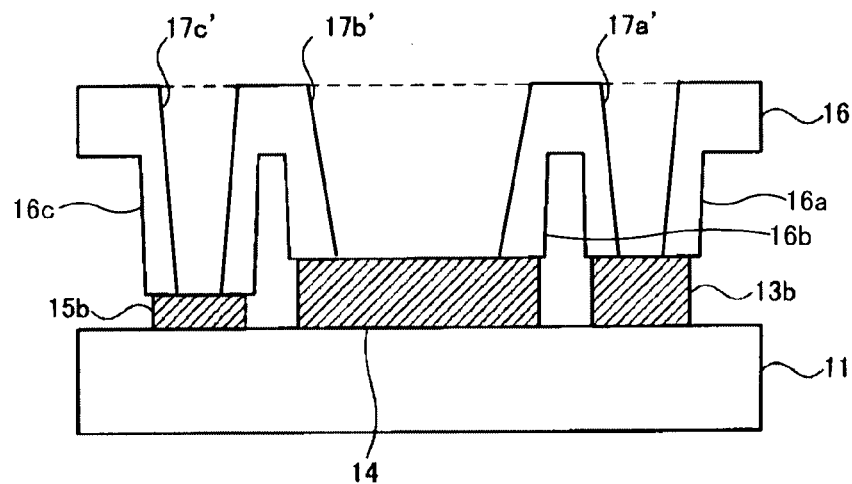
FIG. 7 is a cross sectional view illustrating a semiconductor device according to another modification of modification of the first embodiment.

Still alternatively, as shown in FIG. 7, the via holes 17a', 17b', 17c' may be in a taper shape. In general, various kinds of etching recipes are known. When the via holes are formed by applying one of the recipes, the formed via holes are often formed in taper shapes as shown in FIG. 7. Therefore, when the via holes 17a', 17b', 17c' having taper shapes are applied, it is easy to optimize the etching process, and the process cost can be reduced.

In the semiconductor device and the manufacturing method of the semiconductor device according to the present embodiment, the GaAs substrates are used as the semiconductor substrate and the cover substrate. However, the substrates are not particularly limited. Alternatively, GaN, SiC, Si, and the like can be used as the semiconductor substrate. In terms of thermal expansion rate, the same material as that of the semiconductor substrate on which the semiconductor element is formed is preferably used as the cover substrate, but a different material may be used as the cover substrate. For example, when a transparent SiC substrate is used as the cover substrate, alignment process becomes easy when the cover substrate is laminated. The cost of the material is suppressed by using a generally-available Si substrate as the cover substrate, and various kinds of etching recipes are known. Therefore, it is easy to optimize the etching process, and the process cost can be reduced.

Second Embodiment

The semiconductor device of the present embodiment is different from the semiconductor device according to the first embodiment as shown in FIG. 1 in that fins are provided on a radiation plate. The semiconductor device of the present embodiment will be explained more specifically.

Figure 8:
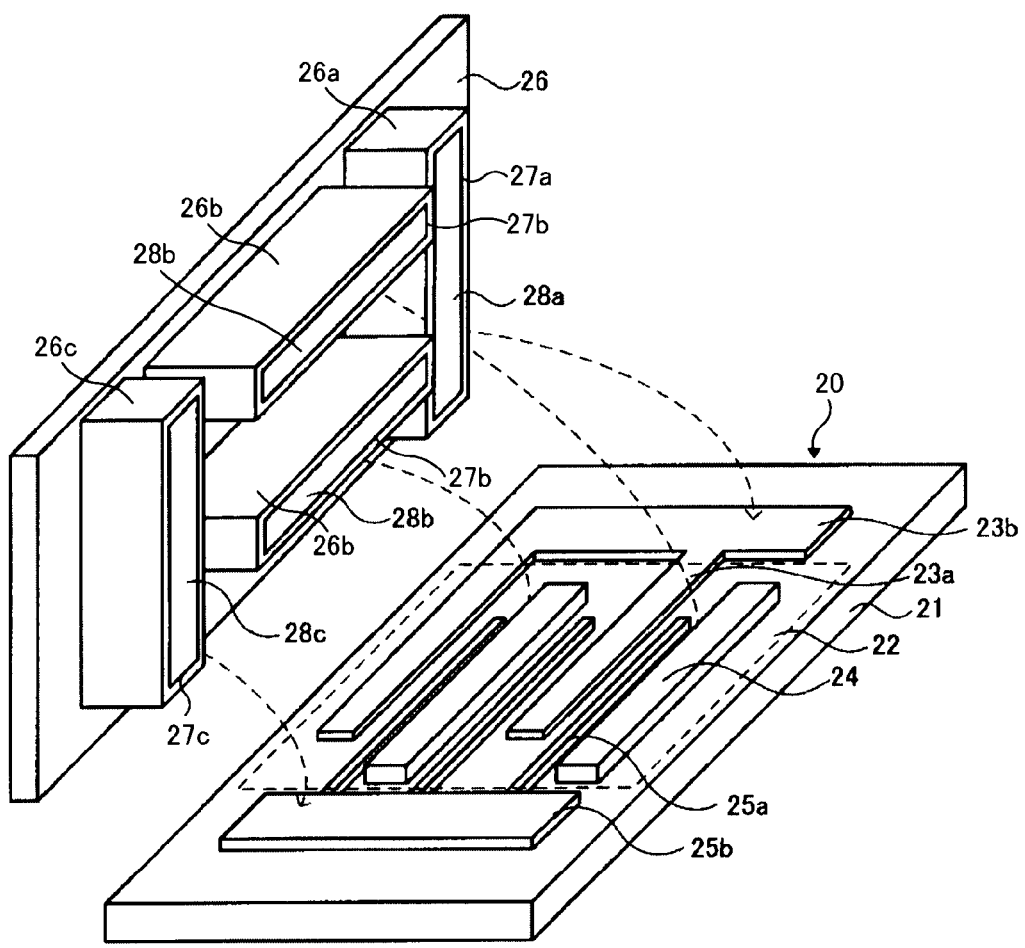
FIG. 8 is an exploded perspective view illustrating a semiconductor device according to a second embodiment.
Figure 9:
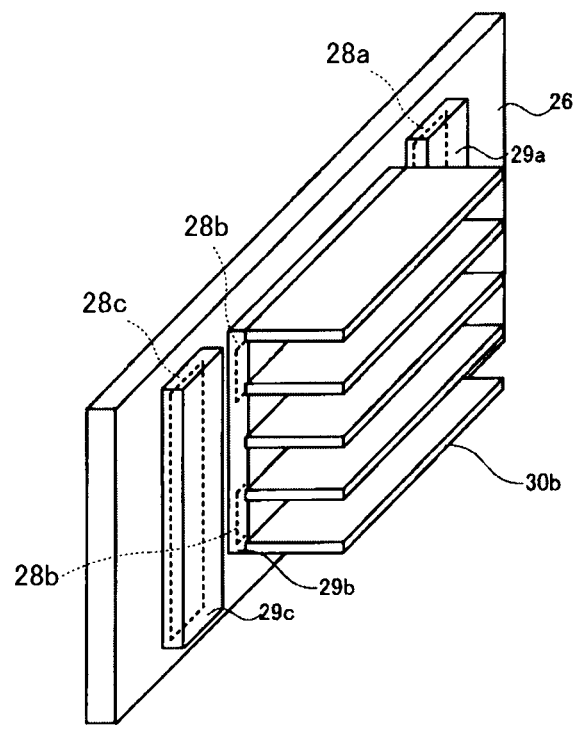
FIG. 9 is a perspective view illustrating a cover substrate when the cover substrate is seen from a front surface side.

FIG. 8 is an exploded perspective view illustrating the semiconductor device according to the present embodiment. On the other hand, FIG. 9 is a perspective view illustrating a cover substrate when the cover substrate is seen from a front surface side. As shown in FIG. 8, the semiconductor element 20 has the same configuration as the semiconductor element 10 as shown in FIG. 1. A source electrode 23a, a drain electrode 24, and a gate electrode 25a arranged to be sandwiched therebetween are formed on an element region 22 of a semiconductor substrate 21. The source electrode 23a and the gate electrode 25a are respectively connected to a source pad 23b and a gate pad 25b, i.e., electrode pads.

As shown in FIG. 8, a configuration at a side of a back surface of a cover substrate 26 has the same configuration as that at the side of the back surface of the cover substrate 16 as shown in FIG. 1, and includes a plurality of protruding portions 26a, 26b, 26c. The protruding portions 26a, 26b, 26c are respectively formed with via holes 27a, 27b, 27c penetrating through the protruding portions 26a, 26b, 26c and the cover substrate 26. Further, metal layers 28a, 28b, 28c are formed inside of the via holes 27a, 27b, 27c, respectively.

With the configuration at the side of the back surface of the cover substrate 26 and the semiconductor element 20 explained above, as shown in FIG. 9, radiation plates 29a, 29b, 29c respectively connected to the metal layers 28a, 28b, 28c are formed on the front surface of the cover substrate 26. These radiation plates 29a, 29b, 29c have the same configurations as the radiation plates 19a, 19b, 19c as shown in FIG. 2. In the present embodiment, radiation fins 30b are provided on the radiation plate 29b connected to the metal layer 28b in contact with the drain electrode.

The semiconductor device is manufactured as follows. According to the manufacturing method of the semiconductor device according to the first embodiment, the cover substrate 26 except the radiation fins 30b is formed, and thereafter, the radiation fins 30b are formed on the radiation plate 29b.

Even in the present embodiment, the heat generated within the semiconductor element 10 can be transmitted from the drain electrode 24, the source pad 23b, and the gate pad 25b to the radiation plates 29b, 29a, 29c by way of the metal layers 28b, 28a, 28c formed within via holes 27b, 27a, 27c penetrating through the cover substrate 26, and dissipated to the outside of the device by way of the radiation plates 29b, 29a, 29c. Therefore, even in the present embodiment, the heat dissipating performance can be improved due to the same reasons as the first embodiment. In addition, the reduction of the device characteristics caused by generated heat can be suppressed.

In addition, according to the present embodiment, the radiation fins 30b are provided on the radiation plate 29b. Therefore, the heat dissipating performance can be further improved. Therefore, the reduction of the device characteristics caused by the generated heat can be better suppressed.

Figure 10:
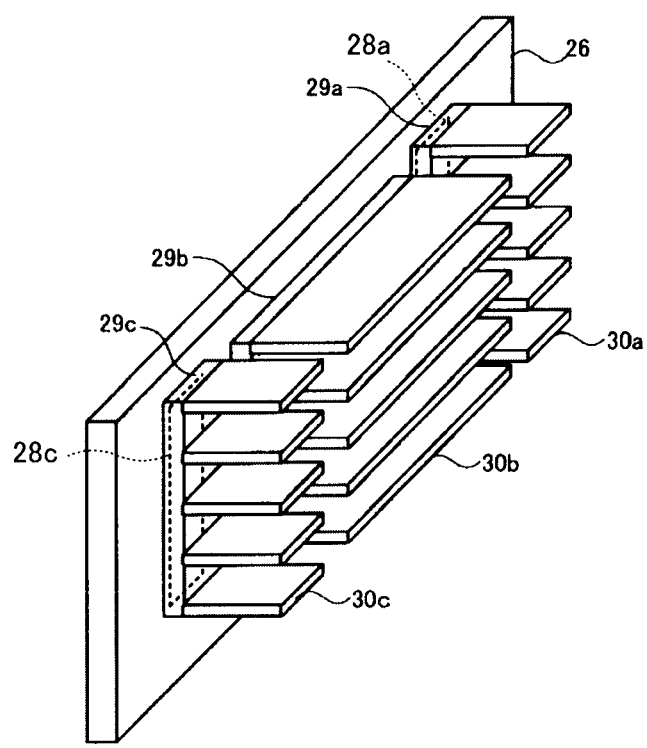
FIG. 10 is a perspective view illustrating a cover substrate of the semiconductor device according to a modification of the second embodiment when the cover substrate is seen from a front surface side.

It should be noted that it is not necessary to form the radiation fins 30b only on the radiation plate 28b connected to the drain electrode 24. As shown in FIG. 10, radiation fins 30a, 30c may be formed on radiation plates 28a, 28c connected to metal layers 28a, 28c in contact with the source electrode 23a, gate electrode 25a, respectively. Therefore, the heat dissipating performance can be further improved.

In these embodiments, in order to increase the heat dissipated from the drain electrodes 14, 24, the radiation plates 19b, 29b are formed to be larger than the other radiation plates 19a, 19c, 29a, 29c. However, the radiation plates formed to be larger are not limited to the radiation plates connected to the drain electrode. As described above, the heat source changes according to the device structure. Therefore, radiation plates connected to electrode closer to the heat source may be formed to be larger than the other radiation plates.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first substrate;
a circuit element formed on a front surface of the first substrate and having a plurality of electrodes;
a second substrate having a first face and laminated on the first substrate so that the first face of the second substrate faces the front surface of the first substrate, the second substrate having a plurality of via holes respectively arranged on the plurality of electrodes; and
a plurality of metal layers respectively formed inside of the plurality of via holes the plurality of metal layers connecting with the plurality of electrodes; and
a plurality of radiation plates formed on a second face of the second substrate and respectively connected to the plurality of metal layers,
wherein the second substrate has a plurality of protruding portions which are formed so as to protrude from the first face and to connect with the plurality of electrodes, the plurality of protruding portions being made of the same material as that of the second substrate and being formed on the first face so as to be spaced apart from each other,
the plurality of via holes penetrate through the second substrate and the plurality of protruding portions, and
there are spaces between the plurality of protruding portions of the second substrate.

2. The semiconductor device according to claim 1, wherein the circuit element has an element region formed on a front surface of the first substrate and including an impurity diffusion region of a semiconductor element, and at least one of the plurality of electrodes is an electrode pad connected to an electrode formed on the element region.

3. The semiconductor device according to claim 1, wherein one of the plurality of electrodes is a drain electrode, and
one of the plurality of radiation plates is connected to the drain electrode.

4. The semiconductor device according to claim 1, wherein the plurality of electrodes are a drain electrode, a source electrode having a source pad, and a gate electrode having a gate pad, and
a height of the protruding portion connected to the gate pad differs from a height of the protruding portion connected to the drain electrode and a height of the protruding portion connected to the source pad.

5. The semiconductor device according to claim 1, wherein the first substrate and the second substrate are formed with the same material.

6. The semiconductor device according to claim 1, wherein at least one of the radiation plates includes a radiation fin.

7. The semiconductor device according to claim 6, wherein the radiation plate having the radiation fin is connected to a drain electrode.

* * * * *